United States Patent
Perner (10) Patent No.: US 6,807,118 B2
(45) Date of Patent: Oct. 19, 2004

(54) ADJUSTABLE OFFSET DIFFERENTIAL AMPLIFIER

(75) Inventor: Frederick A. Perner, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 2 days.

(21) Appl. No.: 10/350,398

(22) Filed: Jan. 23, 2003

(65) Prior Publication Data

US 2004/0145957 A1 Jul. 29, 2004

(51) Int. Cl.$^7$ .................................................. G11C 7/02
(52) U.S. Cl. ..................... 365/209; 365/205; 365/207; 365/208; 365/213
(58) Field of Search ............................... 365/209, 205, 365/207, 208, 213

(56) References Cited

U.S. PATENT DOCUMENTS

| | | | | |
|---|---|---|---|---|
| 4,987,327 A | * | 1/1991 | Fernandez et al. | .......... 327/543 |
| 5,568,438 A | * | 10/1996 | Penchuk | ..................... 365/208 |
| 6,262,625 B1 | | 7/2001 | Perner et al. | |
| 6,388,521 B1 | * | 5/2002 | Henry | ......................... 330/258 |
| 6,586,989 B2 | * | 7/2003 | Perner et al. | .................. 330/9 |
| 6,674,679 B1 | * | 1/2004 | Perner et al. | ............... 365/209 |

* cited by examiner

Primary Examiner—Connie C. Yoha
(74) Attorney, Agent, or Firm—Brian R. Short (57) ABSTRACT

The invention includes an adjustable offset differential amplifier. The adjustable offset differential amplifier includes a first differential transistor receiving a first differential input, and a second differential transistor receiving a second differential input. A differential amplifier output includes an amplitude proportional to a difference between the first differential input and the second differential input. The first differential transistor includes a plurality of sub first differential transistors. Each sub first differential transistor includes an adjustable back gate bias. Control circuitry can be connected to the adjustable back gate bias of each of the sub first differential transistors for reducing offset errors of the differential amplifier output.

25 Claims, 13 Drawing Sheets

FIGURE 13

ADJUSTABLE OFFSET DIFFERENTIAL AMPLIFIER

FIELD OF THE INVENTION

The invention relates generally to an amplifier. More particularly, the invention relates to an adjustable offset differential amplifier.

BACKGROUND OF THE INVENTION

There are many uses for differential amplifiers. For example, differential amplifiers are commonly used within operational amplifiers, which are prevalent in electronics. Differential amplifiers can also be used to sense a logical state of memory cells within an array of memory cells.

Offset errors of differential amplifiers can limit performance of the differential amplifier. For example, differential amplifiers can be used to sense the resistance of a resistive memory cell. Offset errors of the differential amplifiers can hinder the reliability of the sensing of the resistive state of the resistive memory cells.

Figure 1:
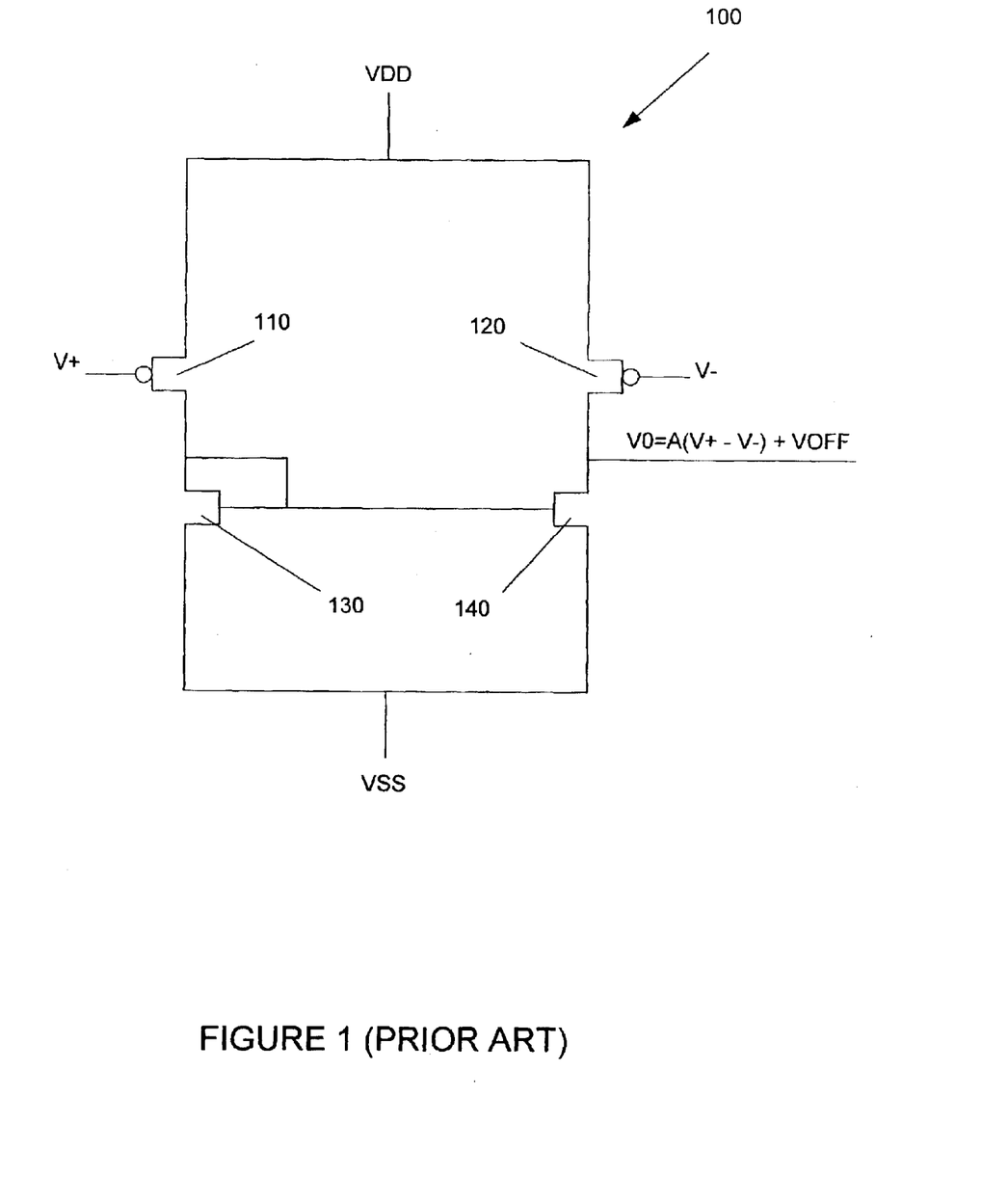
FIG. 1 shows a differential amplifier that includes an offset.

FIG. 1 shows a typical differential amplifier 100 that includes an offset error. The differential amplifier 100 can include a first input transistor 110, a second input transistor 120, a first output transistor 130 and a second output transistor 140.

An output signal VO of the differential amplifier 100 is generally linearly related to a difference between a first input V+ and a second input V−. The output signal VO generally includes an offset error VOFF. The output signal can be represented by VO=A(V+−V−)+VOFF where A is the gain of the differential amplifier 100.

Offset errors of differential amplifiers can be caused by physical design, or processing variations of the differential amplifiers. Circuit device thresholds, mismatches of device sizes, and circuit device operating conditions are all possible sources of offset errors. Physical size variations and process variations inherent in integrated circuit manufacturing processing are sources of offset errors. Processing errors are a major source of offset error in CMOS operations amplifiers that include differential amplifiers.

A technique that has been used to minimize offset errors includes manipulating transistor sizing and physical circuit element layouts. Another technique includes the use of a switched capacitor circuit. Both of these technique require special manufacturing processing steps.

It is desirable to have an apparatus and method for reducing offset error associated with a differential amplifier. It is desirable that the apparatus and method provide an adjustment of the offset errors that is linear, and reduce the offset error with a positive or negative correction. It is desirable that the apparatus and method be robust, temperature insensitive and be simple to manufacture.

SUMMARY OF THE INVENTION

The invention includes an apparatus and method for reducing offset error associated with a differential amplifier. The differential amplifier of the invention is adaptable for use within a sense amplifier of MRAM.

A first embodiment of the invention includes an adjustable offset differential amplifier. The adjustable offset differential amplifier includes a first differential transistor receiving a first differential input, and a second differential transistor receiving a second differential input. A differential amplifier output includes a signal having an amplitude proportional to a difference between the first differential input and the second differential input. The first differential transistor includes a plurality of sub first differential transistors. Each sub first differential transistor includes an adjustable back gate bias. Control circuitry can be connected to the adjustable back gate bias of each of the sub first differential transistors for reducing offset errors of the differential amplifier output.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in an apparatus and method for reducing offset error associated with a differential amplifier. The apparatus and method provides an adjustment of the offset errors that is typically linear, and reduces the offset error with a positive or negative correction. The apparatus and method is robust and generally temperature insensitive.

Figure 2:
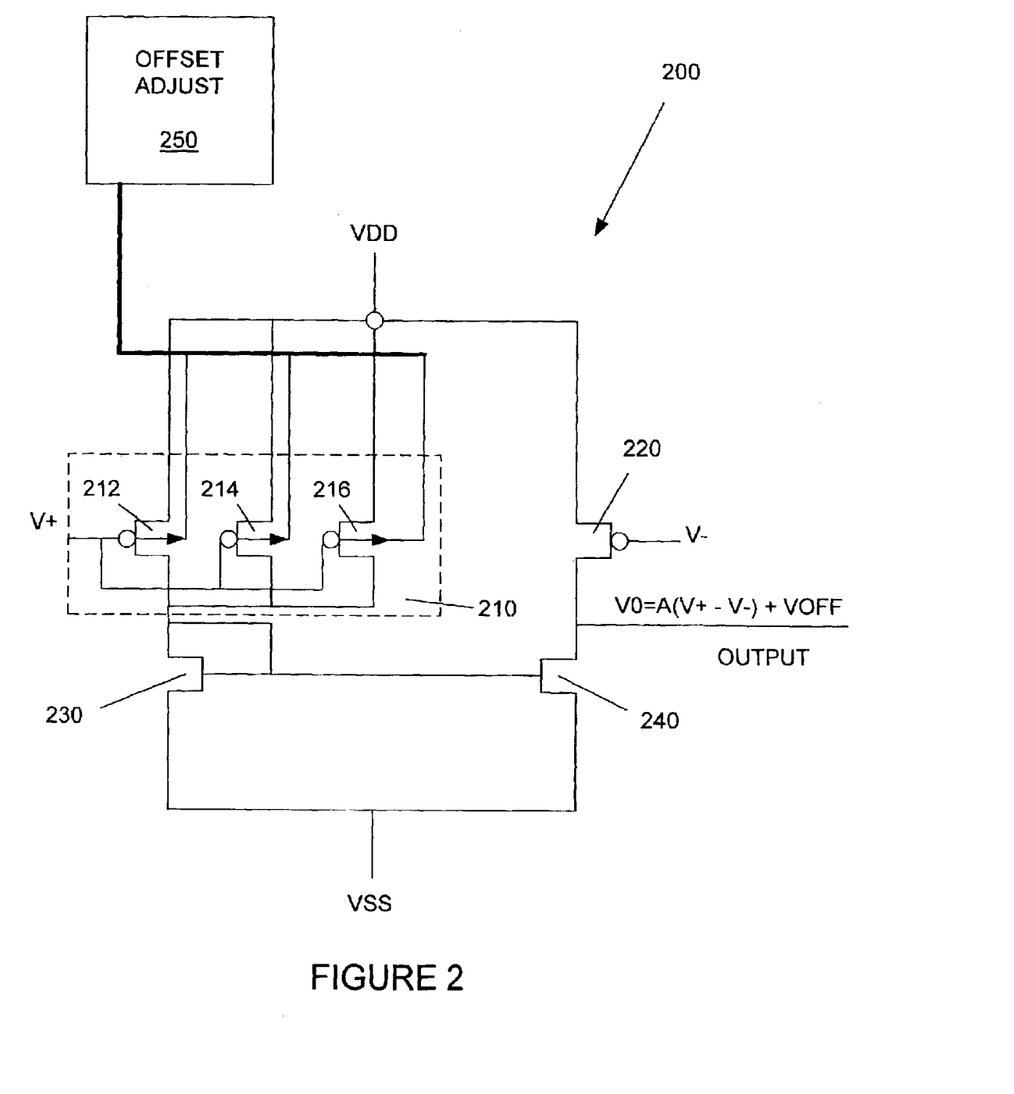
FIG. 2 shows a differential amplifier including offset reduction circuitry according to an embodiment of the invention.

FIG. 2 shows an offset differential amplifier 200 including offset reduction circuitry according to an embodiment of the invention. The offset differential amplifier 200 includes a first differential transistor 210 receiving a first differential input (V+). A second differential transistor 220 receives a second differential input (V−). A differential amplifier output (OUTPUT) includes a signal that generally has a signal amplitude proportional to a difference between the first differential input (V+) and the second differential input (V−). The first differential transistor 210 can include a plurality of sub first differential transistors 212, 214, 216. Each sub first differential transistor 212, 214, 216 includes an adjustable back gate bias.

Offset adjust control circuitry 250 can be connected to the adjustable back gate bias of each of the sub first differential transistors 212, 214, 216 for reducing offset errors of the differential amplifier output (OUTPUT).

Generally, each of the sub first differential transistors 212, 214, 216 include physical dimension that are different than each of the other sub first differential transistors 212, 214, 216. An embodiment includes the sub first differential transistors 212, 214, 216 being configured so that the physical dimensions of the sub first differential transistors 212, 214, 216 are progressively larger. That is, each sub first differential transistors 212, 214, 216 is physically scaled to be a predetermined ratio larger than one other of the sub first differential transistors 212, 214, 216. For example, the physical dimension of each sub first differential transistor 212, 214, 216 can be approximately twice the physical dimension of another sub first differential transistor 212, 214, 216. Another example includes the physical dimension of each sub first differential transistor 212, 214, 216 being approximately ten times the physical dimension of another sub first differential transistor 212, 214, 216.

The output (OUTPUT) is generated by a combination of a first output transistor 230 and a second output transistor 240. As previously described, the output (OUTPUT) includes a signal that can be represented by VO=A (V+−V−)+VOFF. The back gate bias control of the sub first differential transistors 212, 214, 216 can be adjusted to minimize VOFF. Details of how the back gate bias control are adjusted will be discussed later.

It is to be understood that FIG. 2 is merely an example of an embodiment of the invention. Other equivalent embodiments can include NMOS differential input transistors and PMOS output transistors. Other equivalent embodiments can include more or less than three sub first differential transistors.

Figure 3:
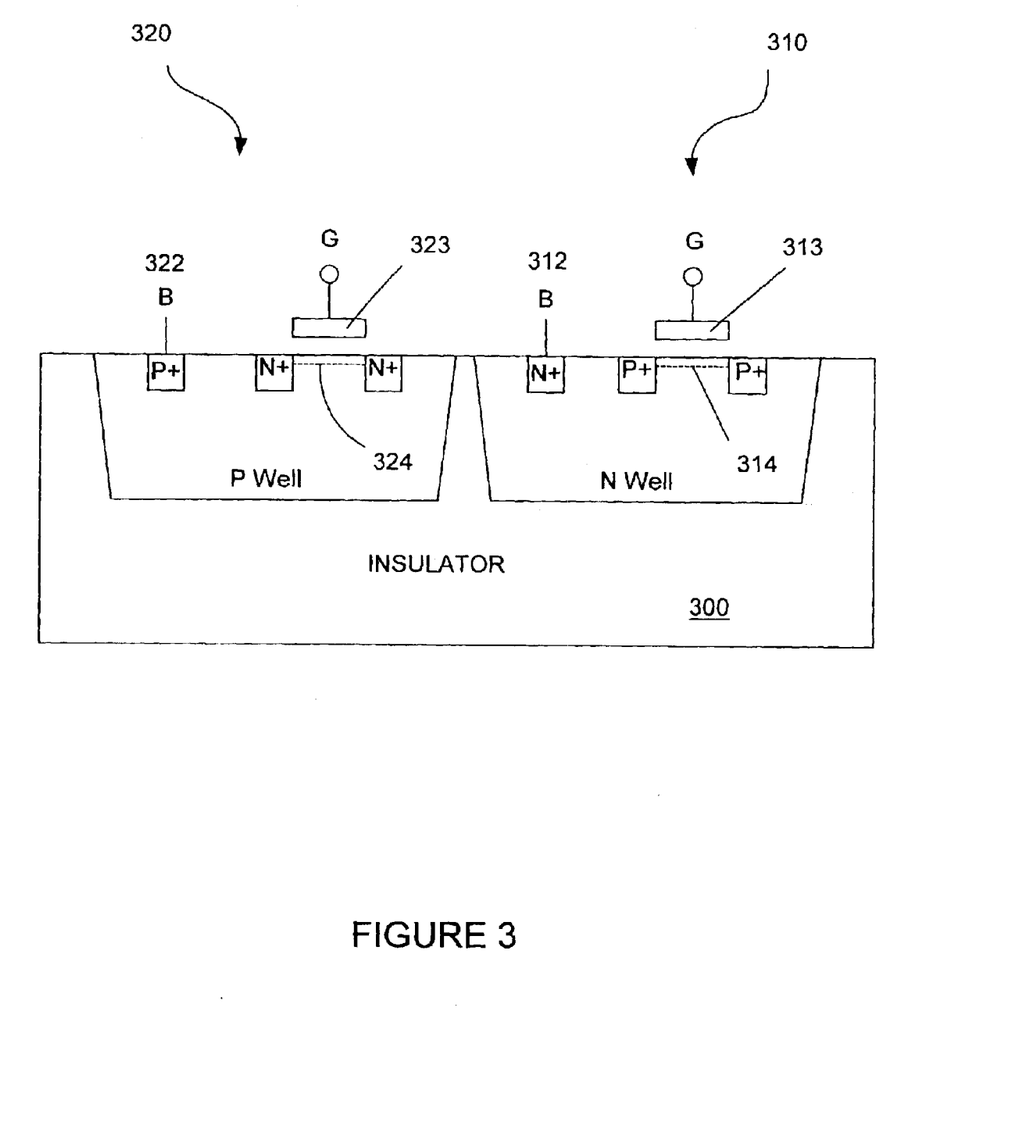
FIG. 3 shows a substrate that includes transistors that include back gate bias adjustments.

FIG. 3 shows a substrate 300 that includes transistors that include a back gate bias adjust. The substrate 300 includes a PMOS 310 and an NMOS transistor 320, in which voltages applied to back gate control terminals (B) 312, 322 provide a back gate bias to each of the transistors 310, 320. Voltages applied to the back gate control terminals (B) can be biased to influence current flow through each of the transistors 310, 320.

As with most transistors, a voltage potential can be applied to the gates (G) 313, 323 of the transistors 310, 320 to cause charge to be collected in channels 314, 324 of the transistors 310, 320 causing the transistors 310, 320 to conduct current. The magnitude of the current conducted is generally dependent upon the magnitude of the voltage potential applied.

A voltage potential can be applied to the back gates (B) 312, 322 (or bulk) of the transistors 310, 320 to additionally control the charge collected by the channels 314, 324 of the transistors 310, 320, which additionally controls the current conducted by the transistors 310, 320.

Both PMOS 310 and NMOS transistors 320 have been disclosed because each of the embodiments of the invention can generally be implemented with either PMOS or NMOS transistors. Generally, the embodiments disclosed include N-well back gate bias transistors. It is to be understood that equivalent embodiments can include P-well back gate bias transistors.

Figure 4:
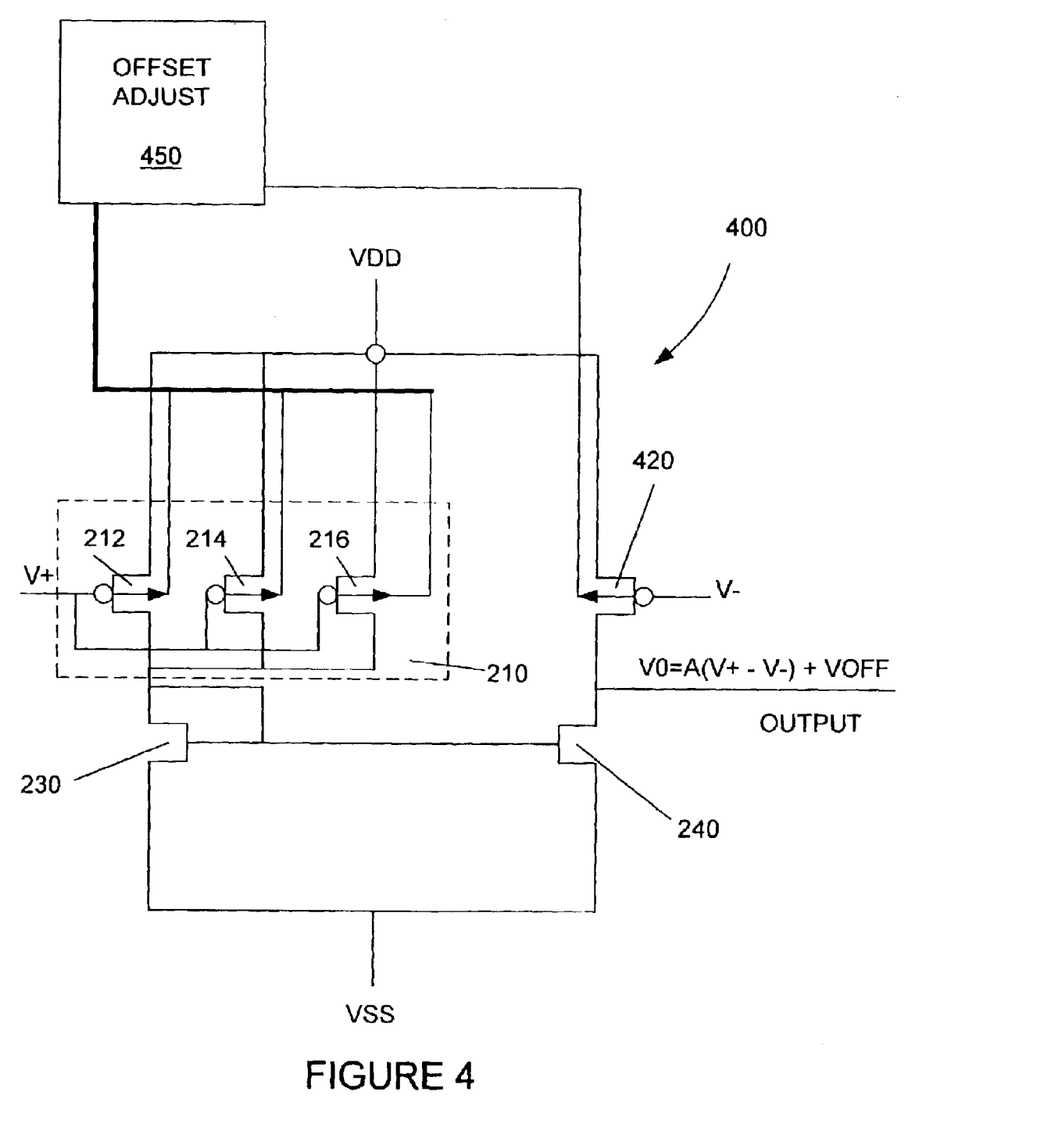
FIG. 4 shows a differential amplifier including offset reduction circuitry according to another embodiment of the invention.

FIG. 4 shows a differential amplifier 400 including offset adjust control circuitry 450 according to another embodiment of the invention. A second differential transistor 420 of another embodiment includes an adjustable back gate bias. The back gate bias of the second differential transistor 420 provides for output offset adjustment in a direction that is opposite of the first differential transistor 210.

The offset adjust control circuitry 450 includes additional circuitry for adjusting the back gate bias of the second differential transistor 420. Details of the offset adjust control circuitry 450 will be described later.

Figure 5:
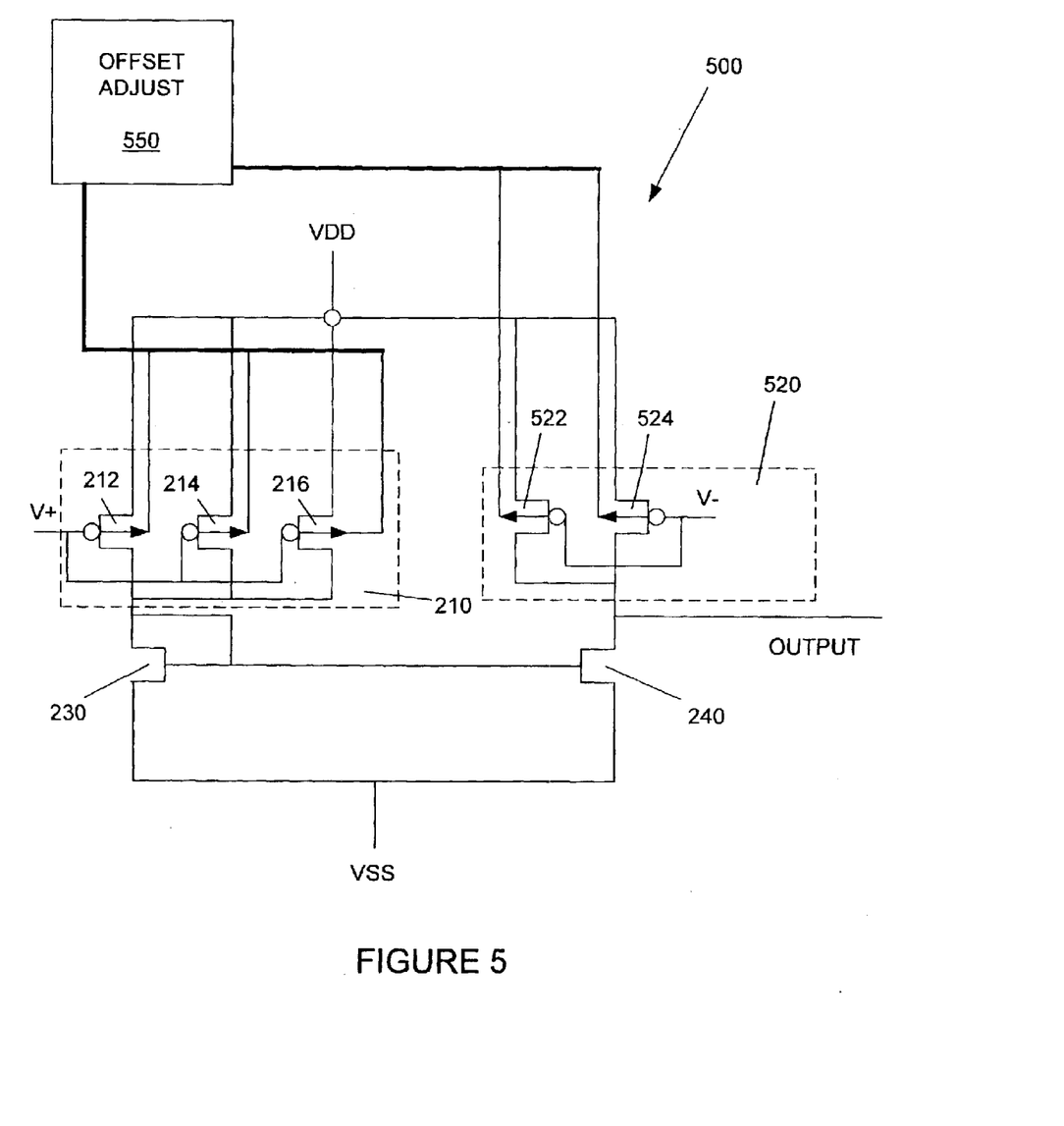
FIG. 5 shows a differential amplifier including offset reduction circuitry according to another embodiment of the invention.

FIG. 5 shows a differential amplifier 500 including offset adjust control circuitry 550 according to another embodiment of the invention. The adjustable offset differential amplifier of this embodiment includes a second differential transistor 520 that includes a plurality of sub second differential transistors 522, 524. Only two sub second differential transistors are included in this embodiment. However, clearly more sub second differential transistors can be included. Each sub second differential transistor 522, 524 includes an adjustable back gate bias for providing adjustment of the offset of the differential amplifier 500.

The offset control circuitry 550 includes a connection to an adjustable back gate bias of each of the sub second differential transistors 522, 524 for reducing offset errors of the differential amplifier output (OUTPUT). Details of the offset adjust control circuitry 550 will be described later.

Each of the sub second differential transistors 522, 524 can include physical dimension that are different than each of the other sub second differential transistors. The sub second differential transistors include progressively larger physical dimension sub second differential transistors. For example, each progressively larger physical dimension sub second differential transistor can be approximately twice the physical dimension of a previous sub second differential transistor. Another example includes each progressively larger physical dimension sub second differential transistor being approximately ten times the physical dimension of a previous sub second differential transistor.

Figure 6:
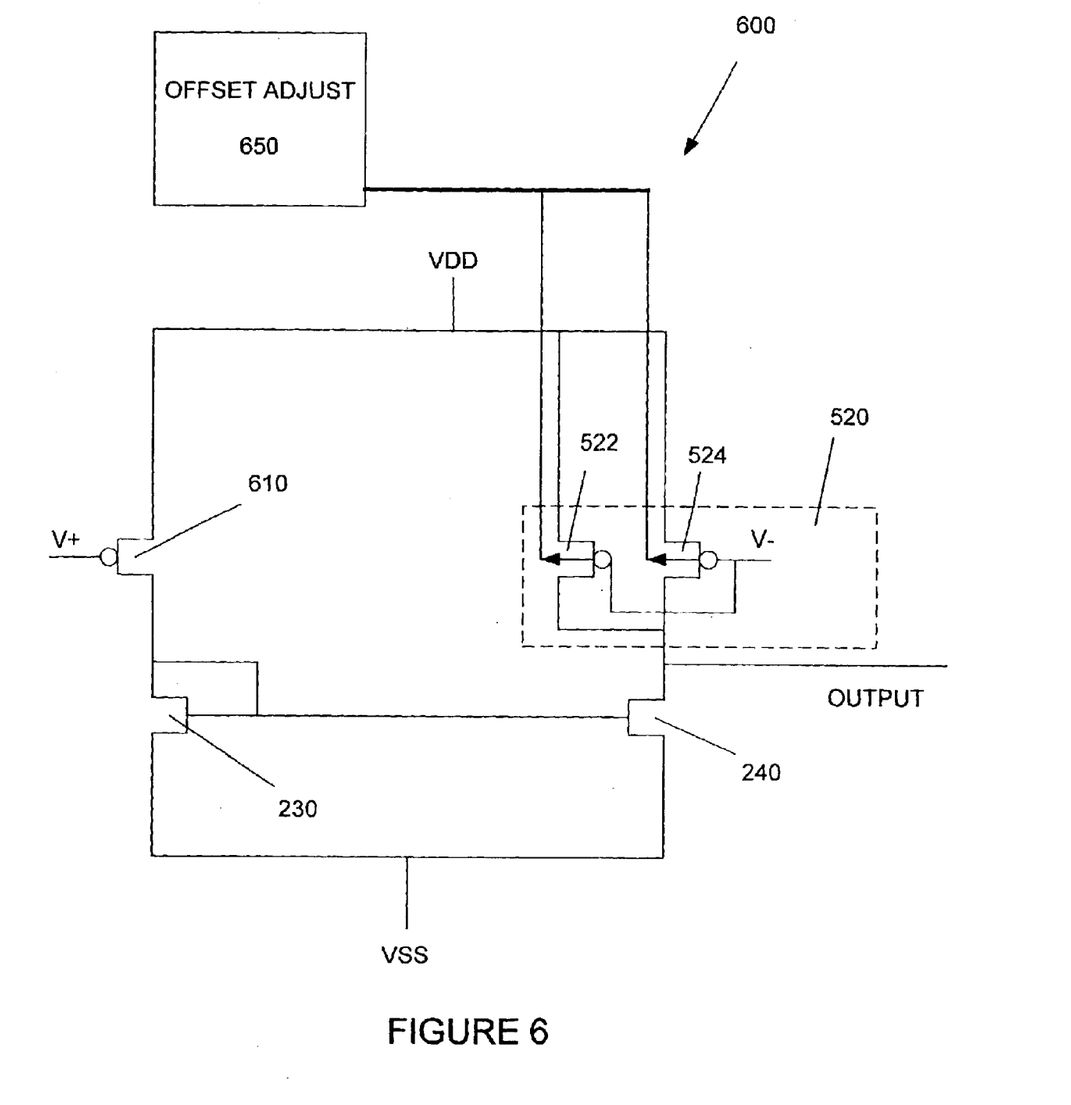
FIG. 6 shows a differential amplifier including offset reduction circuitry according to another embodiment of the invention.

FIG. 6 shows a differential amplifier 600 including offset reduction control circuitry 650 according to another embodiment of the invention. The embodiment includes a first differential input transistor 610 that does not include a back gate bias control, and a second input differential transistor 520 that is the same as the second input differential transistor 520 of FIG. 5.

Figure 7:
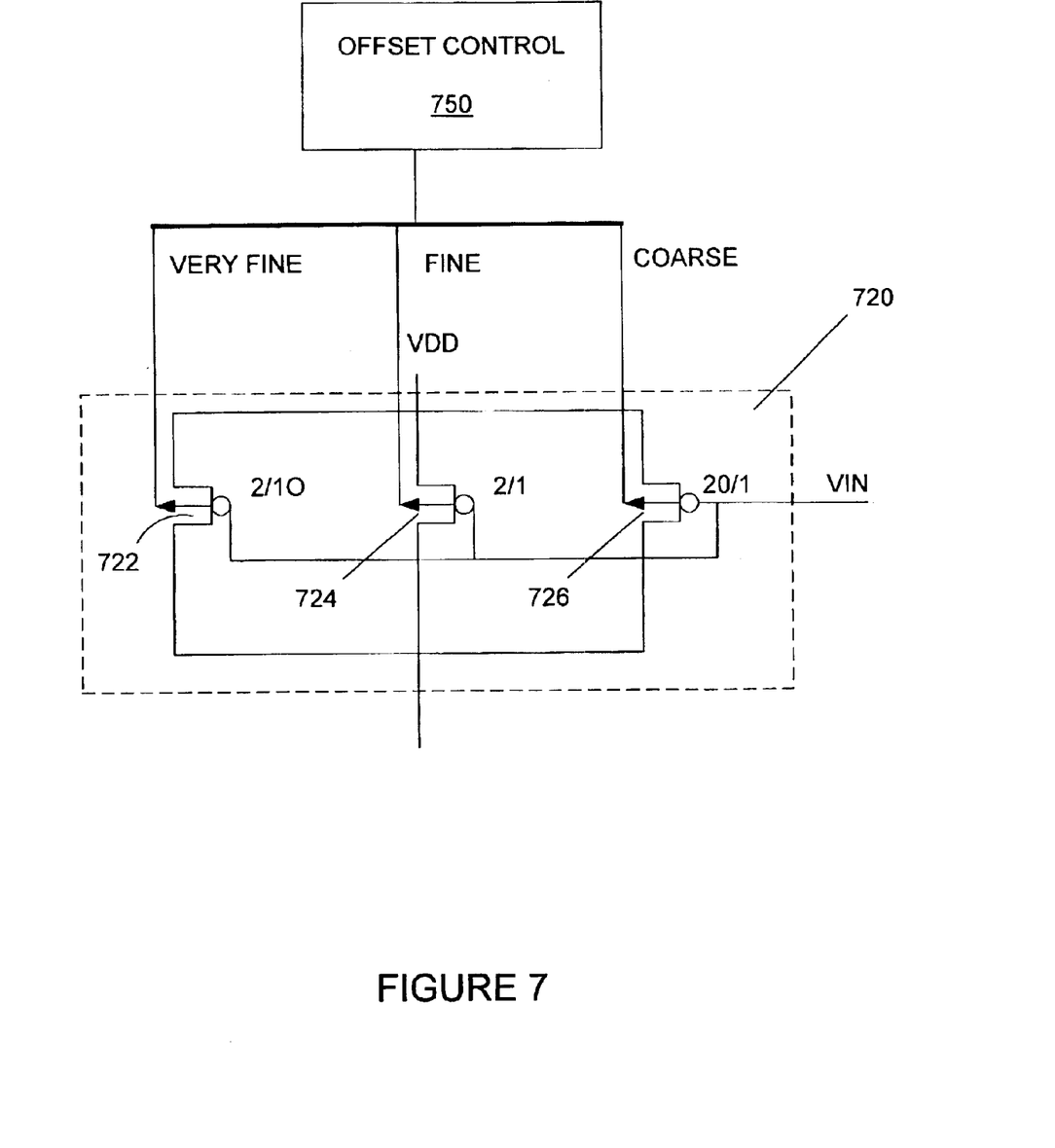
FIG. 7 shows physical dimensions of sub differential amplifier transistors of a differential transistor according to an embodiment of the invention.

FIG. 7 shows physical dimensions of a sub differential amplifier transistors 722, 724, 726 of a differential input transistor 720 according to an embodiment of the invention. Physical dimensions of the sub differential amplifier transistors 722, 724, 726 are provided next to the sub differential amplifier transistors 722, 724, 726. The physical dimensions represent a width to length ratio of a channel of the corresponding transistor. For example, a channel width to length ratio of a first sub differential amplifier transistor 722 is 2/10. A channel width to length ratio of a second sub differential amplifier transistor 724 is 2/1. A channel width to length ratio of a third sub differential amplifier transistor 726 is 20/1. An offset adjustment sensitivity of the first sub differential amplifier transistor 722 can be designated as very fine. An offset adjustment sensitivity of the second sub differential amplifier transistor 724 can be designated as fine. An offset adjustment sensitivity of the third sub differential amplifier transistor 726 can be designated as coarse. The sensitivity of each sub differential amplifier transistor 722, 724, 726 is proportional to the channel width to length ratio of the sub differential amplifier transistor 722, 724, 726.

An embodiment of the offset reduction control circuitry 750 includes very fine, fine and course back gate bias adjustments of the sub differential amplifier transistors 722, 724, 726.

Figure 8:
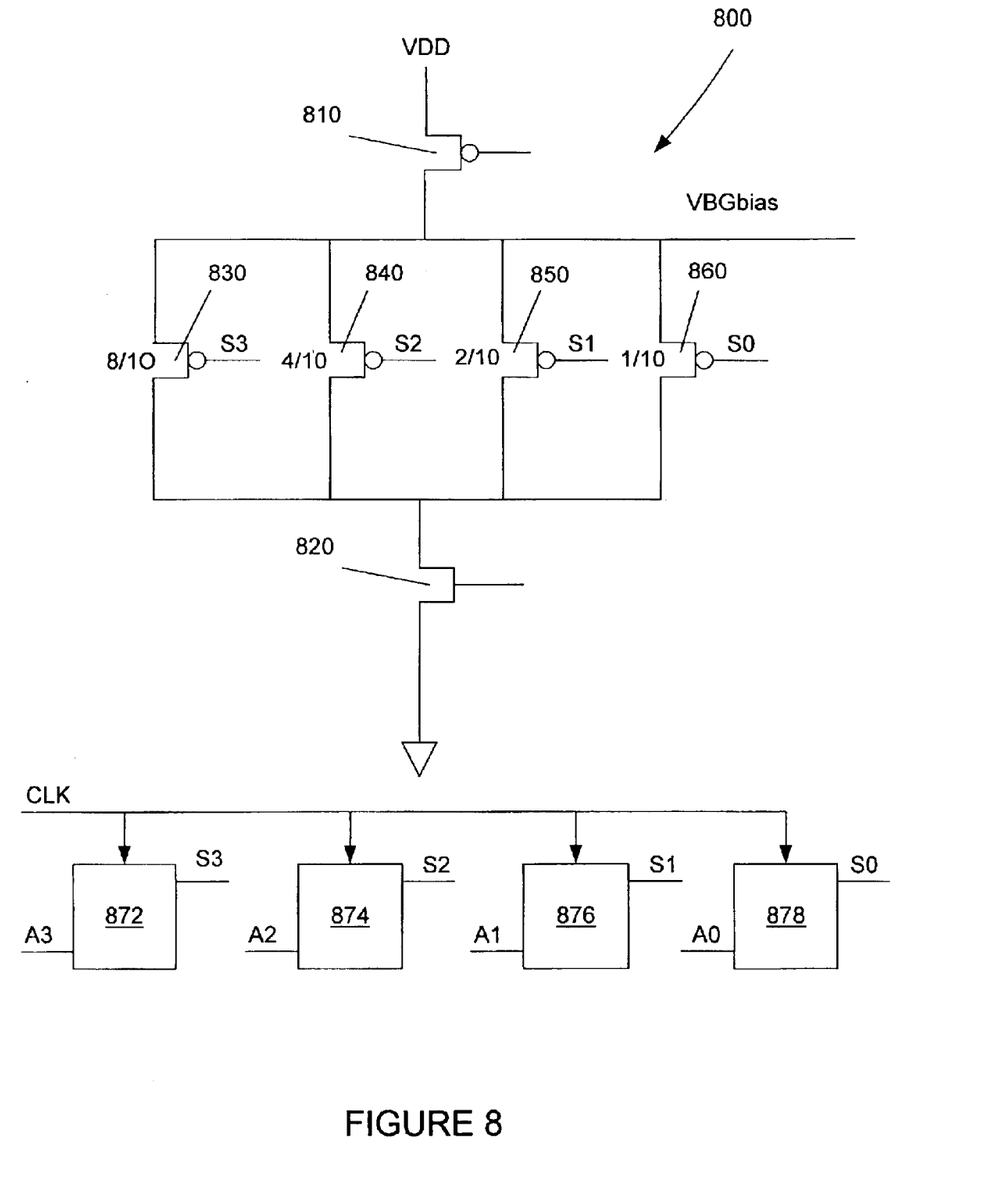
FIG. 8 shows an offset adjust controller according to an embodiment of the invention.

FIG. 8 shows an offset adjust controller 800 according to an embodiment of the invention. Generally, the offset adjust controller 800 can be connected to a back gate bias of a single sub differential amplifier transistor. That is, for multiple sub differential amplifier transistors, an offset adjust controller 800 can be connected to a back gate of each of the multiple sub differential amplifier transistors.

The offset adjust controller 800 of FIG. 8 includes a programmable voltage divider for generating a back gate bias voltage for isolated wells of one of the sub differential amplifier transistors. The voltage divider is connected between a source of operating potential (VDD) and a reference potential (GND).

The voltage divider is formed by upper and lower transistors 810, 820, and by four middle transistors 830, 840, 850, 860 having different drain-source path resistances. Turning on different combinations of the middle transistors 830, 840, 850, 860 changes the voltage drop between VDD and GND, thereby, setting the voltage potential of VBGbias. The voltage divider voltage drop is applied to a back gate of a corresponding sub differential amplifier transistor.

During a normal mode of operation, the middle transistors 830, 840, 850, 860 are turned on and off according to a first number stored in a first group of latches 872, 874, 876, 878. The embodiment of FIG. 8 includes the offset adjust controller 800 controlling the back gate bias voltage by as many as $2^4$ different levels. Control lines S0, S1, S2, S3 determine which of the middle transistors 830, 840, 850, 860 are included within the voltage divider.

The upper transistor 810 can be used to control the power to the back gate bias circuits. The lower transistor 820 can be used to select 1 of 2 or more back gate bias circuits. The back gate bias circuits can operate in pairs and share a common group of latch circuits 872, 874, 876, 878. A first back gate bias circuit can be used to adjust the offset in a first direction, and a second back gate bias circuit can be used to adjust the offset in a second (opposite) direction. When the lower transistor 820 is off, the voltage potential of VBGbias is generally equal to the voltage potential of VDD. When the lower transistor 820 is on, the voltage potential of VBGbias is generally set by the voltage divider.

Figure 9:
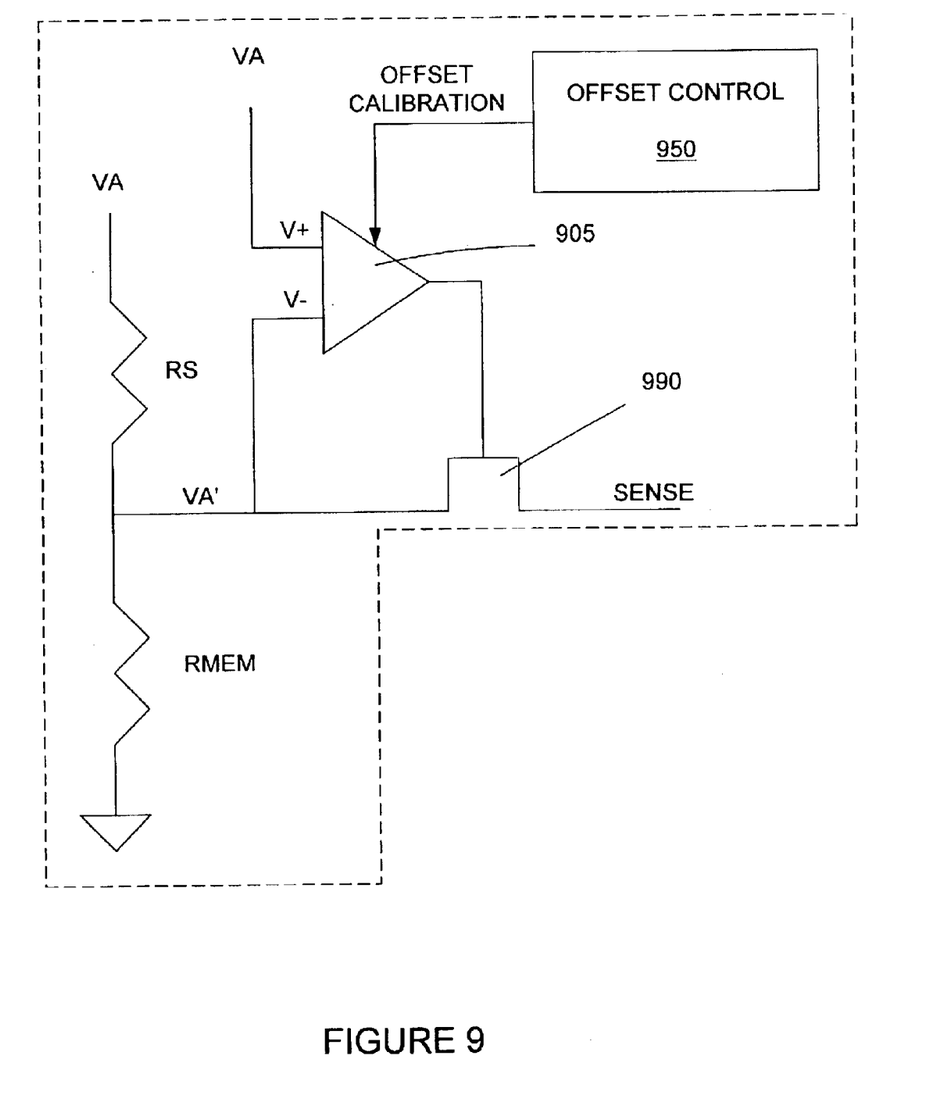
FIG. 9 shows a resistive cross-point memory cell and a differential amplifier including offset reduction circuitry according to an embodiment of the invention.

FIG. 9 shows a resistive cross-point memory cell (RMEM) and a differential amplifier including offset reduction circuitry according to an embodiment of the invention. An operational amplifier 905 can include the previously described differential amplifiers 200, 400, 500. The resistive cross-point memory cell includes a resistance that is dependent upon a logical state stored within the resistive cross-point memory cell. An output SENSE can sense the logical state of the cross-point memory cell RMEM by applying a sense voltage and sensing a resulting current.

A sense voltage VA is applied to a first input V+ of the operational amplifier 905. A resulting secondary sense voltage VA' is generated across the cross-point memory cell RMEM. The sense voltage is also applied by default across all of the other cross-point memory cells within an array of cross-point represented by RS.

Sensing the resistive state of a single memory cell in an array of memory cells can be unreliable. Generally, all memory cells in the array are coupled together through many parallel paths. The resistance at one cross point is generally equal the resistance of the cross point in parallel with the resistance of memory cells of the other rows in columns (the array of memory cells can be characterized as a cross point resistor network). If the memory cell being sensed has a different resistance due to stored magnetization, a small difference voltage may develop. This small differential voltage can give rise to a parasitic or "sneak path" current. The parasitic current is typically larger than the sense current, and therefore, can obscure the sense current. Consequently, the parasitic current can prevent the resistance from being sensed.

Ideally, the sense voltage VA and the secondary sense voltage VA' are identical. Differences in the sense voltage VA and the secondary sense voltage VA' cause current ("sneak path" current) to flow through the non-selected resistive memory cells of an array of resistive memory cells. RS represents the resistance of the non-selected memory cells of the array of resistive memory cells. Current flowing through the non-selected memory cells cause errors in the current detected at the SENSE output due to the sense voltage VA, and therefore, introduce inaccuracies in the detection of the resistive state of the cross-point memory cell RMEM.

Offset errors of differential amplifiers internal to the operational amplifier 905 cause the sense voltage VA and the secondary sense voltage VA' to deviate. The invention can be used to reduce the offset errors of the differential amplifiers within the operational amplifier 905. Therefore, the invention can be used to improve the performance of a resistive memory cell by reducing current flow through non-selected resistive memory cells.

The following table provides actual simulated sensitivities of the very fine, fine and course back gate bias adjustments as shown in FIG. 7, for the resistive cross-point memory cell (RMEM) and a differential amplifier including offset reduction circuitry of FIG. 9. The differential amplifier simulation includes a supply voltage VDD of 3.3 V, a back gate voltage range of 3.2 to 3.3 V, a VA value of 0.5 V, an RMEM value of 1 Mega Ohm, and an RS value of 1 Kilo Ohm.

| RANGE | SENSITIVITY | RANGE | MIN. STEP SIZE |
|---|---|---|---|
| COARSE | 196 mV/v | 19.6 mV | 1.22 mV |
| FINE | 15.1 mV/V | 1.51 mV | 94 uV |
| VERY FINE | 1.67 mV/V | 170 uV | 1.1 uV |

The table depicts RANGE and MIN. STEP SIZE of the offset adjustment for the resistive cross-point memory cell and differential amplifier of FIG. 9, with the sub differential amplifier transistors of FIG. 7, and the offset controller of FIG. 8. For this embodiment, the coarse offset control has a range of 19.6 mV and a minimum offset control step size of 1.22 mV. For this embodiment, the fine offset control has a range of 1.51 mV and a minimum offset control step size of 95 uV. For this embodiment, the very fine offset control has a range of 170 uV and a minimum offset control step size of 1.1 uV.

The state of the latches (for example, latches 872, 874, 876, 878 in FIG. 8) in the back gate bias controller (for example, the offset adjust controller 800) is set during a calibration operation of the sense amplifier. Typically, during calibration, the offset of the sense amplifier (differential amplifier) is varied until a test condition is met. Once the test condition has been met, the offset setting that meets the test condition is held by the back gate bias controller. That is, the offset setting state is held by the back gate controller latches (for example, latches 872, 874, 876, 878 in FIG. 8).

The test condition can include adjusting the sense amplifier offset until a target sense current equal to VA/RMEM is obtained. Once the target sense current has been obtained, the settings of the back gate controller latches are maintained.

The time required to determined the optimal calibration can be minimized by including several ranges of calibration. For example, the previously described coarse, fine and very fine ranges of calibration can be used to determine the optimal offset adjustment. The coarse calibration adjustment can be used to quickly limit the range of the calibration. The fine and very fine calibration adjustments can be used to determine the optimal calibration point. The size of the memory being sensed is limited by the precision of the offset adjustment control during calibration. Therefore, a robust very fine calibration allows proper sensing of a larger size memory array than otherwise would be possible.

Figure 10:
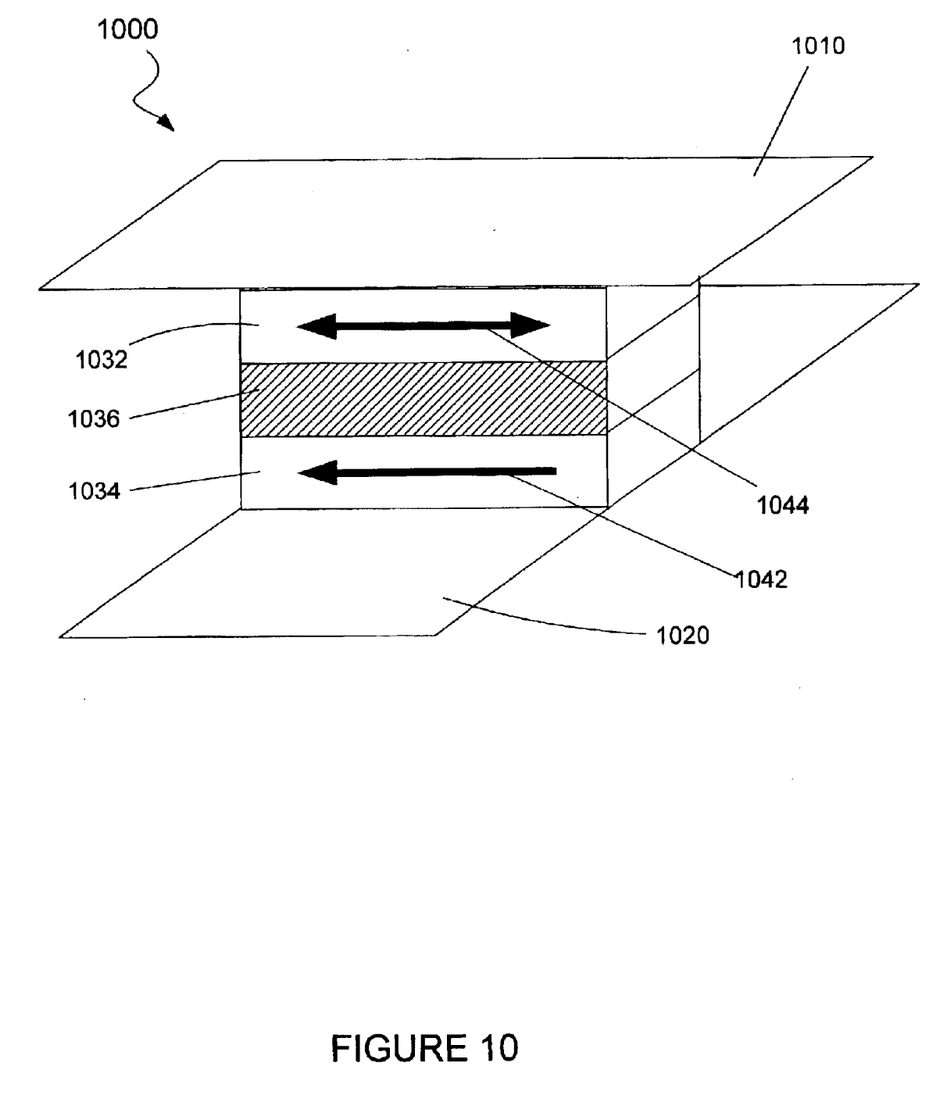
FIG. 10 shows an example of a resistive cross-point memory cell.

FIG. 10 shows an embodiment of a magnetic tunnel junction 1000 that can be used as a resistive memory cell. The magnetic tunnel junction 1000 includes a pinned layer 1034, a sense layer 1032 and a insulating tunnel barrier 1036.

The pinned layer 1034 has a magnetization orientation that is fixed, and will not rotate in the presence of an applied magnetic field in a range of interest. The sense layer 1032 has a magnetization that can be oriented in either of two directions. A first magnetization orientation of the sense layer 1032 is in the same direction as the fixed magnetization of the pinned layer 1034. A second magnetization orientation of the sense layer 1032 is in the opposite direction as the fixed magnetization of the pinned layer 1034.

A resistance across the magnetic tunnel junction 1000 will vary in magnitude depending upon the magnetic orientation of the sense layer 1032 with respect to the magnetic orientation of the pinned layer 1034. Typically, if the sense layer 1032 has a magnetic orientation that is in the opposite direction as the pinned layer 1034, then the resistance across the magnetic tunnel junction 1000 will be large. If the sense layer 1032 has a magnetic orientation that is in the same direction as the pinned layer 1034, then the resistance across the magnetic tunnel junction 1000 will be less.

The resistive state of the magnetic tunnel junction is determined by comparing a sensed resistance with a predetermined resistive threshold value, and making a magnetic tunnel junction state determination based upon the comparison. That is, if the sensed resistance is less than the predetermined threshold value, then the state of the magnetic tunnel junction is a first state. If the sensed resistance is greater than the predetermined threshold value, then the state of the magnetic tunnel junction is the second state.

If the magnetization of the sense layer and a reference layer of a magnetic tunnel junction are in the same direction, the orientation of the magnetic tunnel junction can be referred to as being "parallel." If the magnetization of the sense layer and the reference layer of the magnetic tunnel junction are in opposite directions, the orientation of the magnetic tunnel junction can be referred to as being "anti-parallel." The two orientations, parallel and anti-parallel, can correspond to magnetic tunnel junction states of low or high resistance.

The insulating tunnel barrier 1036 allows quantum mechanical tunneling to occur between the reference layer 1034 and the sense layer 1032. The tunneling is electron spin dependent, causing the resistance of the magnetic tunnel junction 1000 to be a function of the relative orientations of the magnetization directions of the reference layer 1034 and the sense layer 1032. The presence of a magnetic field can be detected by establishing the magnetization orientation of the reference layer 1034 and the sense layer 1032.

The resistance of the magnetic tunnel junction 1000 is a first value (R) if the magnetization orientation of the magnetic tunnel junction 1000 is parallel and a second value (R+delta) if the magnetization orientation is anti-parallel.

The insulating tunnel barrier 1036 can be made of aluminum oxide, silicon dioxide, tantalum oxide, silicon nitride, aluminum nitride, or magnesium oxide. The sense layer 1032 may be made of a ferromagnetic material.

Figure 11:
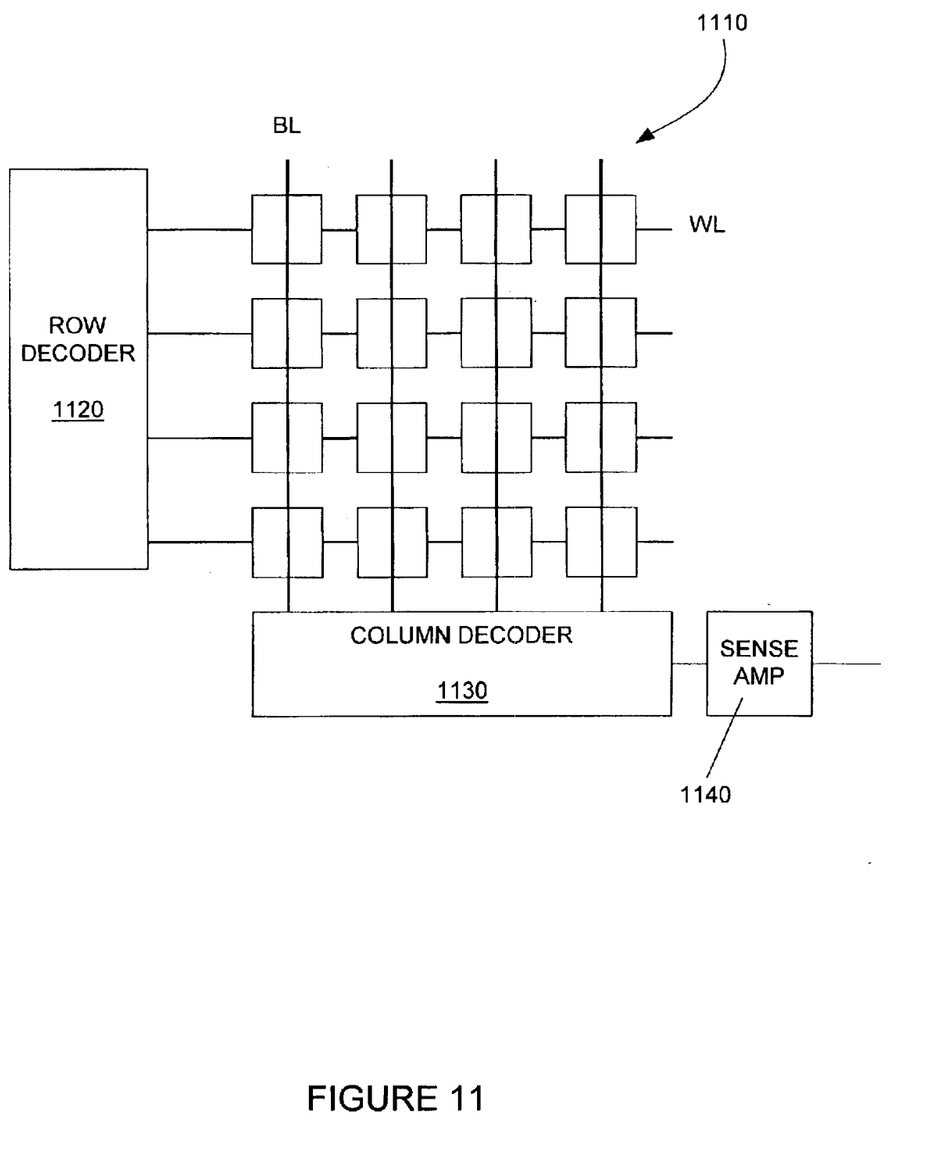
FIG. 11 shows an array of resistive cross point memory cells according to an embodiment of the invention.

FIG. 11 shows an array of resistive cross point memory cells 1110 according to an embodiment of the invention. The cross-point memory array 1110 can be part of a cross-point memory system. Each resistive cross-point memory cell can include an MRAM memory cell. Generally, a row decoder 1120 and a column decoder 1130 select a memory cell. A logical state of the selected memory cell can be sensed by a sense amplifier 1140.

Figure 12:
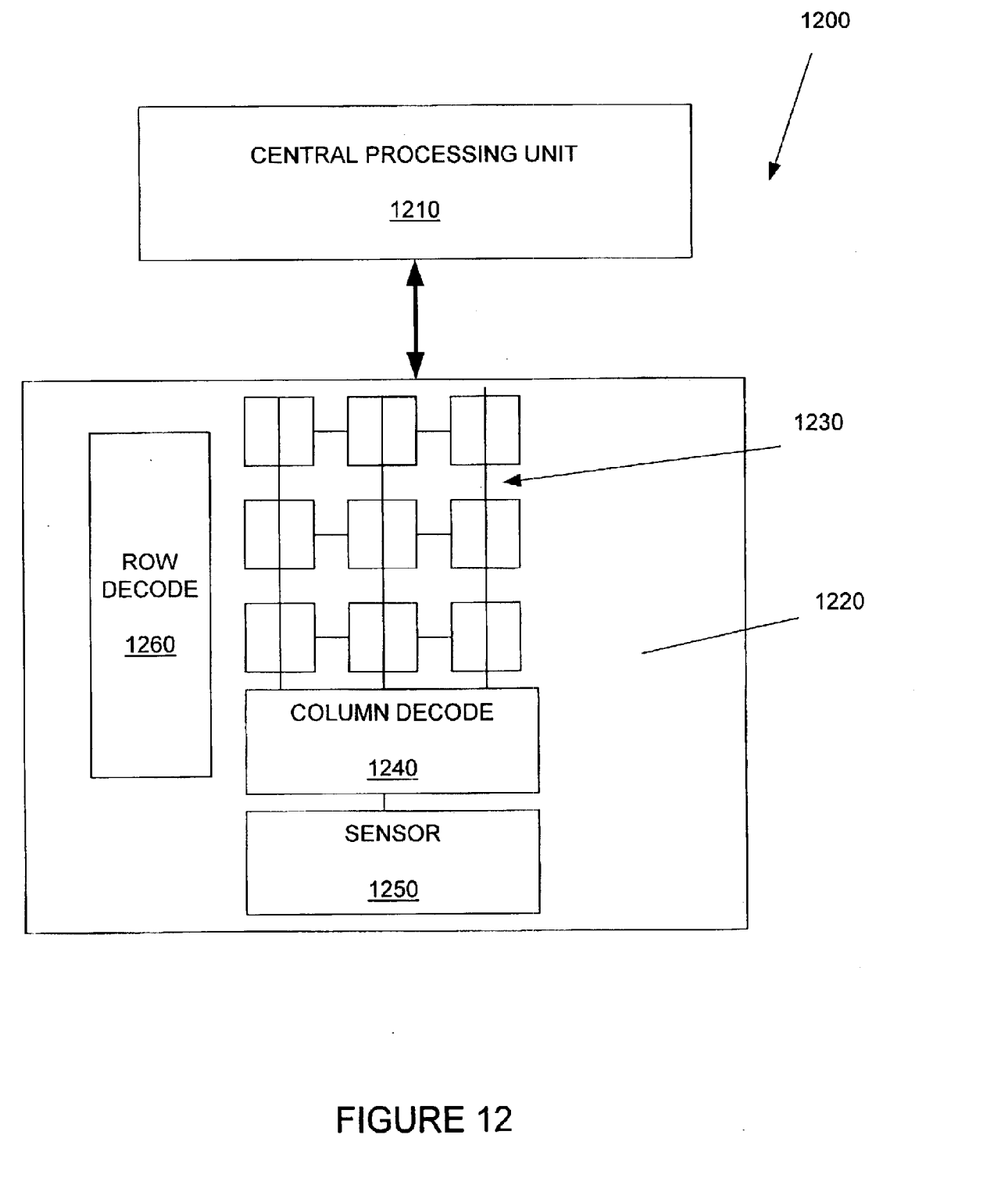
FIG. 12 shows a computing system that includes an array of resistive cross point memory cells according to an embodiment of the invention.

FIG. 12 shows a computing system 1200 that includes an array of resistive cross point memory cells according to an embodiment of the invention. The computing system 1200 includes a central processing unit 1210. The computing system 1200 further includes an array of cross-point memory cells 1230. The central processing unit 1210 can store and access data within the array of cross-point memory cells 1230. Generally, a row decoder 1260 and column decoder 1240 select a memory cell to be sensed. A plurality of resistive cross-point memory cell sensors 1250 can be electrically connected to each of the cross-point memory cells. Each resistive cross-point memory can include an MRAM memory cell.

Figure 13:
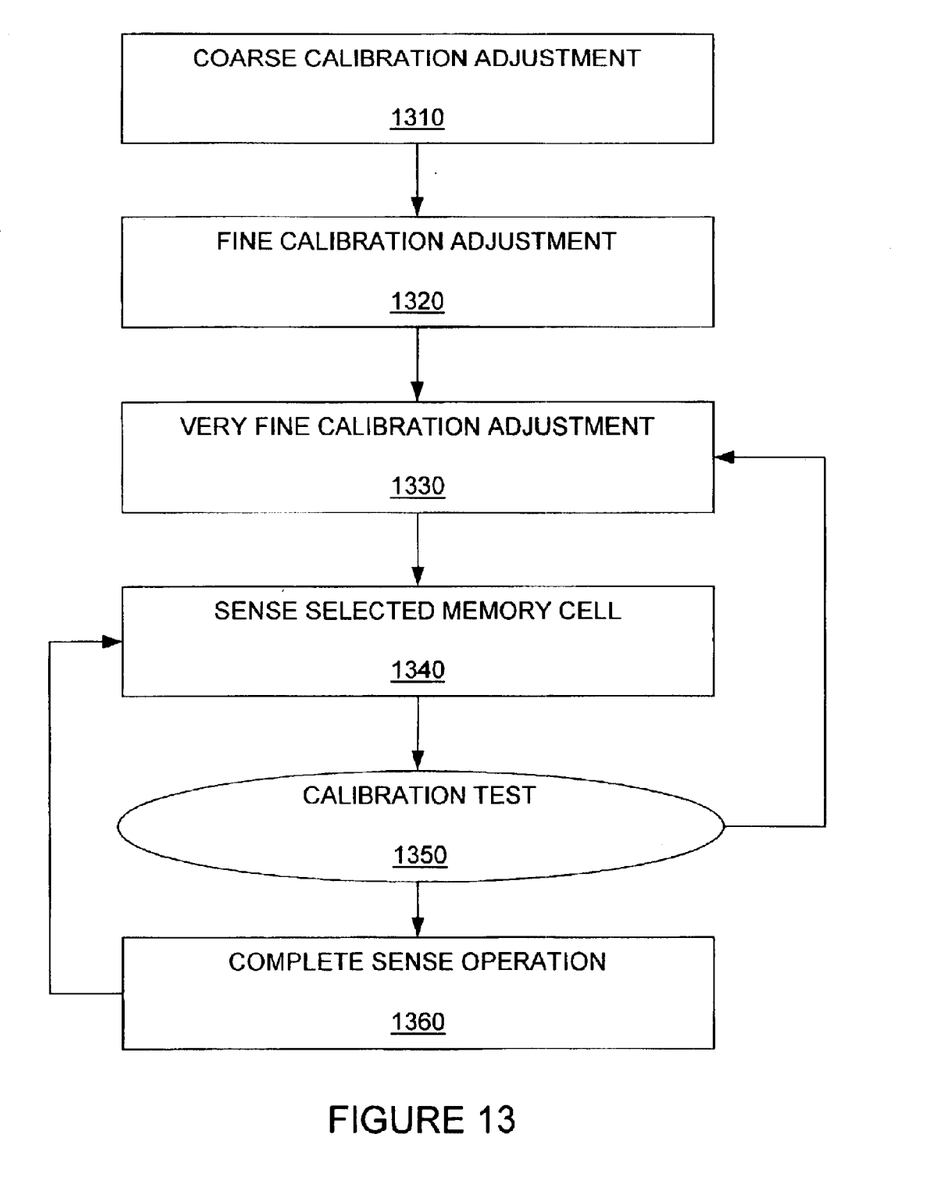
FIG. 13 shows steps included within a method reducing offset errors of a differential amplifier according to an embodiment of the invention.

FIG. 13 shows steps included within a method reducing offset errors of a differential amplifier according to an embodiment of the invention.

A first step 1310 includes a course calibration adjustment. A state of a coarse calibration register can be varied until a coarse calibration state satisfies a calibration test criteria (as previously described). The coarse adjustment can be initially set based upon general knowledge of the operation of the sense amplifier.

A second step 1320 includes a fine calibration adjustment. The process for performing the fine calibration is similar to the process for performing the coarse calibration. However, a back gate bias of sub differential amplifier transistor corresponding to the fine calibration (generally, a second sub differential amplifier transistor) is varied by a fine calibration controller to control the offset using the fine step controls. Again, the fine adjustment can be initially set based upon general knowledge of the operation of the sense amplifier.

A third step 1330 includes a very fine calibration adjustment. The process for performing a very fine calibration is similar to the process for performing the fine calibration. However, a back gate bias of sub differential amplifier transistor corresponding to the very fine calibration (generally, a third sub differential amplifier transistor) is varied by a very fine calibration controller to control the offset using the fine step controls. Again, the very fine adjustment can be initially set based upon general knowledge of the operation of the sense amplifier.

A fourth step 1340 includes selecting a row and column address of a memory cell within an array of memory cells, and performing a first sense of a corresponding selected memory cell.

A fifth step 1350 includes a calibration test that is performed before completing a sense operation. If the sense current is within a predetermined range, the sense operation is successful. If the sense current is not within the predetermined range, the state (setting) of the very fine calibration is modified, and the sense operation is repeated.

A sixth step 1360 includes completing the sense operation, and generating sensed data from the selected memory cell. The sensed data is transferred to the output of the array of memory cells. The sense operation can then be repeated for a new address. Note that the coarse and fine calibration setting generally remain, and the new address may require only a very fine calibration adjustment to sense the memory cell corresponding to the new address.

Although specific embodiments of the invention have been described and illustrated, the invention is not to be limited to the specific forms or arrangements of parts so described and illustrated. The invention is limited only by the appended claims.

What is claimed:

1. An adjustable offset differential amplifier comprising:
   a first differential circuit receiving a first differential input;
   a second differential circuit receiving a second differential input;
   a differential amplifier output having an amplitude proportional to a difference between the first differential input and the second differential input;
   the first differential circuit comprising;
      a plurality of sub first differential transistors, gates of the sub first differential transistors receiving the first differential input, each sub first differential transistor having an adjustable back gate bias, each of the plurality of sub first differential transistors providing a different offset adjustment sensitivity;
      control circuitry connected to the adjustable back gate bias of each of the sub first differential transistors for reducing offset errors of the differential amplifier output.

2. The adjustable offset differential amplifier of claim 1, wherein each of the sub first differential transistors comprises physical dimension that are different than each of the other sub first differential transistors.

3. The adjustable offset differential amplifier of claim 2, wherein the sub first differential transistors include progressively larger physical dimension sub first differential transistors.

4. The adjustable offset differential amplifier of claim 3, wherein each progressively larger physical dimension sub first differential transistor is approximately twice the physical dimension of the previous sub first differential transistor.

5. The adjustable offset differential amplifier of claim 3, wherein each progressively larger physical dimension sub first differential transistor is approximately ten times the physical dimension of the previous sub first differential transistor.

6. The adjustable offset differential amplifier of claim 1, wherein the second differential circuit comprises and adjustable back gate bias.

7. The adjustable offset differential amplifier of claim 1, the second differential circuit comprising:
   a plurality of sub second differential transistors, each sub second differential transistor having an adjustable back gate bias; and the control circuitry being connected to the adjustable back gate bias of each of the sub second differential transistors for reducing offset errors of the differential amplifier output.

8. The adjustable offset differential amplifier of claim 7, wherein each of the sub second differential transistors comprises physical dimension that are different than each of the other sub second differential transistors.

9. The adjustable offset differential amplifier of claim 8, wherein the sub second differential transistors include progressively larger physical dimension sub second differential transistors.

10. The adjustable offset differential amplifier of claim 9, wherein each progressively larger physical dimension sub second differential transistor is approximately twice the physical dimension of the previous sub second differential transistor.

11. The adjustable offset differential amplifier of claim 9, wherein each progressively larger physical dimension sub second differential transistor is approximately ten times the physical dimension of the previous sub second differential transistor.

12. A resistive cross-point memory cell sensor comprising:
   an adjustable offset differential amplifier, the adjustable offset differential amplifier comprising:
      a first differential circuit receiving a sensed signal that represents a signal of a sensed resistive cross-point memory cell;
      a second differential circuit receiving a reference input;
      a differential amplifier output having an amplitude proportional to a difference between the sensed signal and the reference input;
      the first differential circuit comprising;
         a plurality of sub first differential transistors, gates of the sub first differential transistors receiving the sensed signal, each sub first differential transistor having an adjustable back gate bias, each of the plurality of sub first differential transistors providing a different offset adjustment sensitivity;
         control circuitry connected to the adjustable back gate bias of each of the sub first differential transistors for reducing offset errors of the differential amplifier output.

13. The resistive cross-point memory cell sensor of claim 12, wherein each of the sub first differential transistors comprises physical dimension that are different than each of the other sub first differential transistors.

14. The resistive cross-point memory cell sensor of claim 13, wherein the sub first differential transistors include progressively larger physical dimension sub first transistors.

15. The resistive cross-point memory cell sensor of claim 14, wherein each progressively larger physical dimension sub first differential transistor is approximately twice the physical dimension of the previous sub first differential transistor.

16. The resistive cross-point memory cell sensor of claim 14, wherein each progressively larger physical dimension sub first differential transistor is approximately ten times the physical dimension of the previous sub first differential transistor.

17. A resistive cross-point memory apparatus comprising:
   a resistive cross-point memory cell;
   an adjustable offset differential amplifier, the adjustable offset differential amplifier comprising:

a first differential circuit receiving a sensed signal that represents a signal of a sensed resistive cross-point memory cell;

a second differential circuit receiving a reference input;

a differential amplifier output having an amplitude proportional to a difference between the sensed signal and the reference input;

the first differential circuit comprising;

a plurality of sub first differential transistors, gates of the sub first differential transistors receiving the sensed signal, each sub first differential transistor having an adjustable back gate bias, each of the plurality of sub first differential transistors providing a different offset adjustment sensitivity;

control circuitry connected to the adjustable back gate bias of each of the sub first differential transistors for reducing offset errors of the differential amplifier output.

18. The resistive cross-point memory cell sensor of claim 17, wherein the resistive cross-point memory cell comprises an MRAM memory cell.

19. The resistive cross-point memory cell sensor of claim 17, wherein each of the sub first differential transistors comprises physical dimension that are different than each of the other sub first differential transistors.

20. The resistive cross-point memory cell sensor of claim 19, wherein the sub first differential transistors include progressively larger physical dimension sub first transistors.

21. A resistive cross-point memory system comprising:

an array of cross-point memory cells;

a plurality of resistive cross-point memory cell sensors that can be electrically connected to each of the cross-point memory cells;

each resistive cross-point memory cell sensor comprising:

an adjustable offset differential amplifier, the adjustable offset differential amplifier comprising:

a first differential circuit receiving a sensed signal that represents a signal of a sensed resistive cross-point memory cell;

a second differential circuit receiving a reference input;

a differential amplifier output having an amplitude proportional to a difference between the sensed signal and the reference input;

the first differential circuit comprising;

a plurality of sub first differential transistors, gates of the sub first differential transistors receiving the sensed signal, each sub first differential transistor having an adjustable back gate bias, each of the plurality of sub first differential transistors providing a different offset adjustment sensitivity;

control circuitry connected to the adjustable back gate bias of each of the sub first differential transistors for reducing offset errors of the differential amplifier output.

22. The resistive cross-point memory system of claim 21, wherein each resistive cross-point memory cell comprises an MRAM memory cell.

23. A computer system comprising:

a central processing unit;

an array of cross-point memory cells, the array of cross-point memory cells that the central processing unit can store and access data, the array of cross-point memory cells comprising;

a plurality of resistive cross-point memory cell sensors that can be electrically connected to each of the cross-point memory cells;

each resistive cross-point memory cell sensor comprising:

an adjustable offset differential amplifier, the adjustable offset differential amplifier comprising:

a first differential circuit receiving a sensed signal that represents a signal of a sensed resistive cross-point memory cell;

a second differential circuit receiving a reference input;

a differential amplifier output having an amplitude proportional to a difference between the sensed signal and the reference input; the first differential circuit comprising;

a plurality of sub first differential transistors, gates of the sub first differential transistors receiving the sensed signal, each sub first differential transistor having an adjustable back gate bias, each of the plurality of sub first differential transistors providing a different offset adjustment sensitivity;

control circuitry connected to the adjustable back gate bias of each of the sub first differential transistors for reducing offset errors of the differential amplifier output.

24. The computer system of claim 23, wherein each resistive cross-point memory cell comprises an MRAM memory cell.

25. A method for reducing offset errors of a differential amplifier, comprising:

adjusting a coarse offset adjustment of the differential amplifier by adjusting a bask gate bias of a first differential amplifier transistor;

adjusting a fine offset adjustment of the differential amplifier by adjusting a back gate bias of a second differential amplifier transistor;

adjusting a very fine offset adjustment of the differential amplifier by adjusting a back gate bias of a third differential amplifier transistor;

sensing an output current of the differential amplifier; and if the sensed output current is not within a predetermined range, repeating the adjusting of the very fine offset adjustment.

* * * * *